United States Patent
Caretti Giangaspro et al.

(10) Patent No.: US 12,359,304 B2
(45) Date of Patent: Jul. 15, 2025

(54) TUNGSTEN SUBOXIDE CERAMIC TARGET

(71) Applicant: SOLERAS ADVANCED COATINGS BV, Deinze (BE)

(72) Inventors: Ignacio Caretti Giangaspro, Madrid (ES); David Debruyne, Ghent (BE); Freddy Fack, Mariakerke (BE); Wilmert De Bosscher, Drongen (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 0 days.

(21) Appl. No.: 18/548,404

(22) PCT Filed: Mar. 4, 2022

(86) PCT No.: PCT/EP2022/055501
§ 371 (c)(1),
(2) Date: Aug. 30, 2023

(87) PCT Pub. No.: WO2022/184879
PCT Pub. Date: Sep. 9, 2022

(65) Prior Publication Data
US 2024/0133024 A1    Apr. 25, 2024
US 2024/0229226 A9    Jul. 11, 2024

(30) Foreign Application Priority Data

Mar. 4, 2021  (BE) .................................. 2021/5168

(51) Int. Cl.
*C23C 14/34*  (2006.01)
*C04B 35/495*  (2006.01)
(Continued)

(52) U.S. Cl.
CPC ........ *C23C 14/3414* (2013.01); *C04B 35/495* (2013.01); *C23C 14/083* (2013.01);
(Continued)

(58) Field of Classification Search
None
See application file for complete search history.

(56) References Cited

U.S. PATENT DOCUMENTS 6,193,856 B1    2/2001    Kida et al.
2004/0256226 A1*  12/2004  Wickersham, Jr. .......................... H01J 37/3435
                                                                           204/298.01
(Continued)

FOREIGN PATENT DOCUMENTS

CN    1918320 A    2/2007
EP    3257827 A1   12/2017
(Continued)

OTHER PUBLICATIONS

International Search Report from corresponding PCT Application No. PCT/EP2022/055501, May 25, 2022.
(Continued)

*Primary Examiner* — Jason Berman
(74) *Attorney, Agent, or Firm* — Workman Nydegger

(57) ABSTRACT

A target for sputtering, use of the target and method of manufacture of the target is provided. The target has a single piece target material for sputter deposition, with at least 1 mm thickness of material for sputtering, having a lamellar structure and comprising a metal oxide with at least 50 wt. % or more of tungsten oxide. The atomic ratio of oxygen over tungsten results in a compound with oxygen deficiency with respect to the stoichiometric tungsten oxide. The method includes spraying metallic tungsten and/or tungsten oxide powder in amounts so as to provide a layer of material for sputtering being at least 1 mm thick and comprising non-stoichiometric tungsten oxide.

14 Claims, 4 Drawing Sheets

(51) Int. Cl.
  *C23C 14/08* (2006.01)
  *H01J 37/34* (2006.01)
(52) U.S. Cl.
  CPC .. *H01J 37/3426* (2013.01); *C04B 2235/3201* (2013.01); *C04B 2235/3258* (2013.01); *C04B 2235/326* (2013.01); *C04B 2235/3279* (2013.01); *C04B 2235/404* (2013.01); *H01J 2237/332* (2013.01)

(56) References Cited

U.S. PATENT DOCUMENTS

| | | | |
|---|---|---|---|
| 2007/0117237 A1* | 5/2007 | Inoue | C23C 14/3414 438/30 |
| 2007/0131536 A1* | 6/2007 | Hartig | H01J 37/3426 204/192.1 |
| 2007/0137999 A1 | 6/2007 | Delrue et al. | |
| 2009/0057137 A1 | 3/2009 | Pitts et al. | |
| 2010/0243427 A1 | 9/2010 | Kozlowski et al. | |
| 2010/0326817 A1 | 12/2010 | Myli et al. | |
| 2011/0249314 A1* | 10/2011 | Wang | G02F 1/1524 359/265 |
| 2012/0275008 A1 | 11/2012 | Pradhan et al. | |
| 2017/0022602 A1* | 1/2017 | Miyanaga | H01L 29/78609 |
| 2022/0025510 A1 | 1/2022 | Yamaguchi et al. | |

FOREIGN PATENT DOCUMENTS

| | | |
|---|---|---|
| JP | 2010180449 A | 8/2010 |
| WO | 2013039251 A1 | 3/2013 |
| WO | 2020189480 A1 | 9/2020 |

OTHER PUBLICATIONS

Belgian Search Report from corresponding BE Application No. 202105168, Nov. 8, 2021.
Paul Lippens et al.: "Economics of Depositing AZO-Front TCO Coatings With High Wall Thickness Rotary Sintered Ceramic Targets," 26th European Photovoltaic Solar Energy Conference and Exhibition, Oct. 13, 2011, pp. 2939-2942.
Chinese Office Action from Corresponding Chinese Patent Application No. CN202280010705.4, Apr. 24, 2025.

* cited by examiner

TUNGSTEN SUBOXIDE CERAMIC TARGET

FIELD OF THE INVENTION

The invention relates to the field of sputtering targets. More specifically it relates to sputtering targets containing tungsten oxide.

BACKGROUND OF THE INVENTION

Tungsten oxide is a versatile material with interesting chemical properties. It can be used in photocatalysis, pollutant reduction, as electrode material in sensors, etc. For example, platinum-activated tungsten trioxide is used for hydrogen detection and for fuel cell electrodes. It also has useful electrochromic properties and it can be used in photoanodes in photoelectrochemical cells, e.g. for water splitting. Also, it can be used in solar cells, batteries, for $CO_2$ reduction, even air purification or as antimicrobial agent. Many of these applications benefit from tungsten oxide layers formed by sputter deposition.

In order to form a tungsten oxide layer by sputter deposition, metallic tungsten targets can be sputtered in "reactive mode", i.e. in an environment not only containing the discharge gas (typically argon), but also oxygen as a reactive gas. Tungsten is sputtered onto a substrate, and reacts with the surrounding oxygen forming tungsten oxide layers. Although metallic tungsten targets are readily available, they suffer from the well-known target poisoning effect when sputtered in reactive mode. A compound metal oxide film is not only formed on the substrate as desired, but also on the sputtering target itself. As a consequence, the sputter yield and thereby the sputter deposition rate is significantly reduced. Moreover, the reactive gas partial pressure presents a hysteresis as a function of the oxygen flow into the chamber. At low oxygen flows, the process operates in so-called metallic mode and the deposited layers are metallic in character. At higher oxygen flows, a compound layer is formed on the substrate, but also on the target surface. The process now operates in so-called poisoned mode and the deposited metal oxide layers are ceramic in character. The transition point from metallic to poisoned mode occurs at a different threshold oxygen flow than the reverse transition and depends on the current state of the target surface. Moreover, the transition between both modes is characterized by a steep change in the sputtering process variables, with small changes in the oxygen flow leading to large variations in the properties of the deposited layers. A working point close to the transition point is thus inherently unstable. This means that a metallic tungsten target provides easily either deposition of metallic tungsten layers or deposition of tungsten trioxide layers. However, deposition of a suboxide layer with a specific non-stoichiometric composition ($WO_x$) becomes technically very difficult with a metallic tungsten target.

Compared to metallic tungsten targets, ceramic tungsten oxide targets provide more stable operation at their working point because target poisoning and the resultant hysteresis effect are largely absent. They thus enable a much better control of the oxygen content in the sputtered layers during deposition of non-stoichiometric tungsten oxide films. However, manufacture and manipulation of ceramic targets is often difficult because of the high melting point of the raw materials, and poor mechanical properties of these ceramics, such as the relatively high brittleness and high hardness of ceramic coatings. In case of tungsten oxide, the use of common high temperature routes for the manufacturing of ceramic sputter target materials may be challenging because it sublimates at low temperatures. Moreover, oxides are usually not good conductors, so sputtering of ceramic targets is usually more restricted in power than metals and requires the use of power supplies with advanced arc management settings. Large area sputtering is preferably executed in (pulsed) DC or MF AC sputtering conditions, e.g. between 5 Hz and around 500 kHz, typically between 100 Hz and 100 kHz. In particular, tungsten trioxide is not a good conductor and sputtering is limited to powering with radiofrequency AC during the process, which is costly and less controllable and cannot be easily scaled to large targets and high-power levels.

SUMMARY OF THE INVENTION

It is an object of embodiments of the present invention to provide a strong target for sputter deposition, where the material for sputtering comprises a thick piece of tungsten oxide material with reduced arcing stable deposition and high dynamic deposition rate (DDR) for depositing tungsten oxide, for example oxygen-deficient tungsten trioxides.

The present invention provides a target having a single piece target material for sputter deposition. The target comprises at least 1 mm, for example at least 2 mm, such as 4 mm or more of thickness of material for sputtering which presents a lamellar structure. The lamellar structure is formed by microscopic splats of material extended in a large area and comparatively small thickness. The material for sputtering comprises a metal oxide with at least 40 wt. %, for example at least 50 wt. %, such as 60 wt. % or 80 wt. % or at least 90 wt. % or even 95 % wt. % or more of tungsten oxide. The atomic ratio of oxygen over metal in the material for sputtering results in a compound with oxygen deficiency with respect to the stoichiometric composition.

It is an advantage of embodiments of the present invention that mechanically strong ceramic targets of highly conductive suboxidic material can be provided. It is an advantage of embodiments of the present invention that the lamellar structure may provide stress relief during target manufacturing, handling and sputtering. It is an advantage that the dynamic deposition rate DDR using the target of the present invention is up to twice as high as the DDR using metal tungsten.

In some embodiments, the single piece target material has a length of at least 0.5 m, e.g. at least 0.7 m or e.g. being 1 m long or larger. This allows sputtering of large substrates, and the target material being a single piece target material, arcing is reduced and sputtering is more stable, as the number of joints between tiles or sleeves in the target can be reduced or even their presence may be avoided altogether.

In some embodiments of the present invention the target material has a resistivity lower than 1000 Ohm·cm, e.g. being lower than 10 Ohm·cm, even being lower than 1 Ohm·cm, such as being lower than 0.1 Ohm·cm, for example 0.01 Ohm·cm or lower. It is an advantage of embodiments of the present invention that a conductive target can be provided.

In some embodiments, the material for sputtering has diffraction peaks at Bragg angles (2θ) of 23.5±0.3 and additionally at least one of the peaks at 40.2°±0.3°, and/or at 40.7°±0.3°, and/or at 32.7°±0.3° in a powder X-Ray diffraction spectrum with Cu-K alpha radiation.

In some embodiments, the target material has diffraction peaks at Bragg angles (2θ) of 23.1°±0.3°, 23.5°±0.3° and 24.3°±0.3° with a dominant XRD peak at 23.5°±0.3°, thus having the highest relative intensity of these three peaks.

In some embodiments, the target material has peaks at 40.2°±0.3°, and at 40.7°±0.3°, where the intensity of the XRD peak at 40.2°±0.3° is higher than the peak at 40.7°±0.3°.

In some embodiments the material for sputtering includes at least a further metal oxide as material balance. It is an advantage of embodiments of the present invention that a layer comprising a mixture of oxide compounds can be provided using a single target.

It is an advantage of embodiments of the present invention that contamination due to target surface irregularities is reduced or avoided.

In some embodiments, the tungsten oxide comprises non-stoichiometric tungsten oxide wherein the ratio of oxygen over tungsten is higher than 2, for example 2.5 or higher, for example 2.7 or higher and lower than 3, for example 2.95 or lower, for example 2.9 or lower. This means that the target material comprises a non-stoichiometric compound, instead or not only a mixture of metallic material and stoichiometric oxide compound.

In some embodiments the material for sputtering includes at least 40 wt. %, such as 50 wt. % or 60 wt. % or 70 wt. % or 80 wt % or 90 wt % or even 95 wt. % of non-stoichiometric tungsten oxide. It is an advantage of embodiments of the present invention that highly pure layers of tungsten compound, e.g. suboxidic tungsten, can be provided by sputtering.

In some embodiments, the material for sputtering includes at least a fraction of metallic tungsten. However, in some embodiments of the present invention, the material for sputtering may include further metal oxides, optionally including metal, such as one or more of an alkali metal oxide, for example lithium oxide, sodium oxide, potassium oxide, and/or one or more of a transition metal oxide, for example titanium oxide, nickel oxide, chromium oxide, zirconium oxide, niobium oxide, silver oxide, tantalum oxide, and/or molybdenum oxide.

It is an advantage of embodiments of the present invention that alkali oxide layers can be provided using such targets. It is an advantage of embodiments of the present invention that transition oxide layers can be provided, which allow tailoring optical and mechanical properties of the deposited layer. It is an advantage that known mixed oxides can be provided, which can be used in sensor applications.

In some particular embodiments, the material for sputtering comprises tungsten oxide and nickel oxide, and showing diffraction peaks at Bragg angles of 44.5°±0.3°, indicating the presence of Ni, e.g. metallic Ni, and/or 43.3°±0.3° from NiO, and/or 31.0°±0.3° from nickel tungsten oxide compound $NiWO_4$.

In a further aspect, the present invention provides a method of providing the target in accordance with embodiments of the previous aspect. The method comprises providing material for sputtering by providing material comprising metallic tungsten and/or tungsten oxide powder. The method includes spraying the material in amounts to provide a layer of material for sputtering being at least 1 mm, e.g. at least 2 mm, e.g. at least 4 mm thick and comprising non-stoichiometric tungsten oxide.

It is an advantage of embodiments of the present invention that a target with suboxidic tungsten can be reliably provided.

In some embodiments, spraying the material is performed on a carrier surface, thereby forming a target with one single piece of target material uniformly provided over a substantial part of the surface of the carrier, optionally being at least 0.5 m long or at least 1 m long on its longest side, for example forming a target with only one single piece of target material uniformly provided over the surface of the carrier.

It is an advantage of embodiments of the present invention that a single piece, monolithic target can be provided with no need of additional steps of adhering pieces to a carrier and with a homogeneous sputtering without corners at grooves.

In some embodiments, providing material comprises providing powder of at least one oxide of tungsten. It is an advantage of embodiments of the present invention that the starting material is a ceramic which can be directly molten and sprayed to form the material for sputtering. It is an advantage of embodiments of the present invention that the starting material may be substoichiometric, advantageously being commercially available.

In some embodiments spraying comprises thermal spraying, controlling the spraying parameters and/or the atmospheric environment during the process as a means to tune the metal to oxide ratio of the tungsten oxide target material.

It is an advantage of embodiments of the present invention that the amount of oxygen in the material for sputtering can be accurately controlled by using atmospheric plasma spraying, or spraying in protective or inert atmosphere.

The present invention provides the use of a ceramic target in accordance with any embodiment of the first aspect for providing a layer of tungsten oxide on a substrate by sputter deposition, optionally for providing a layer of non stoichiometric oxygen-deficient tungsten oxide on a substrate by appropriate control of oxygen gas during the deposition process.

It is an advantage of embodiments of the present invention that a sputtering with easy ignition, stable AC or DC sputtering and high dynamic deposition rate (DDR), up to twice the rate of metallic tungsten, can be obtained.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
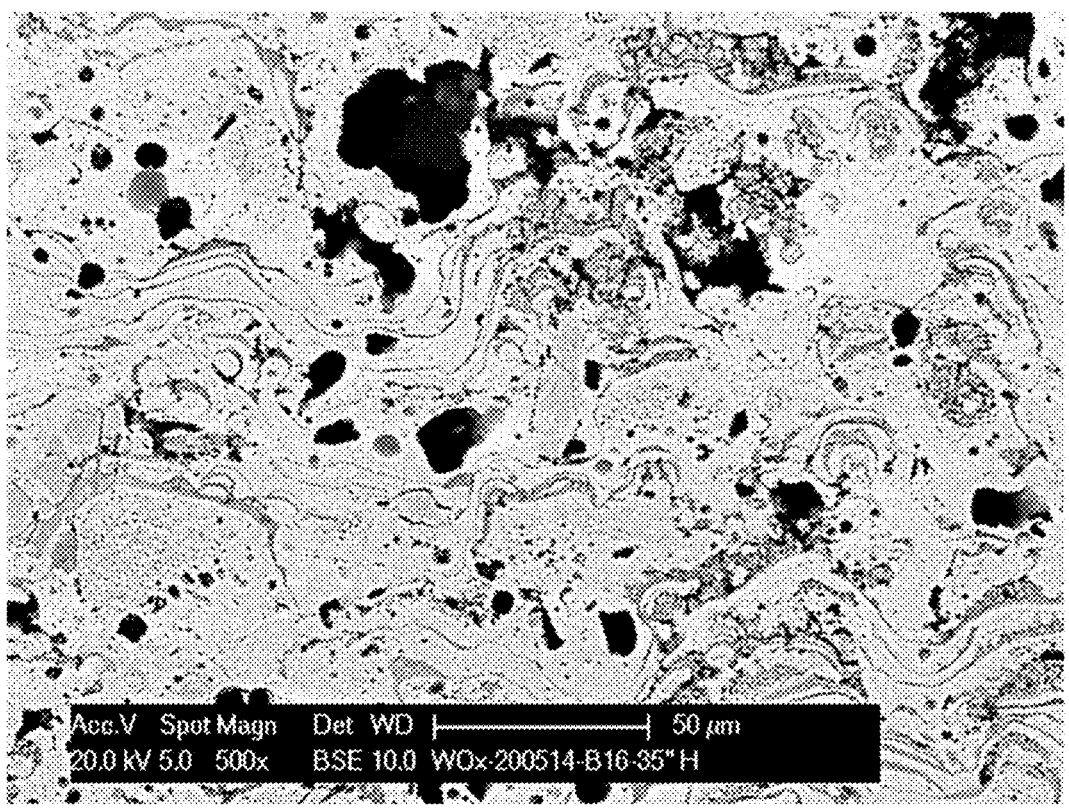
FIG. 1 illustrates an electron micrograph of a target material cross section of a ceramic target in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "lamellar structure", reference is made to a structure typically formed by overlapping microscopic splats of sprayed material, such as the structure formed by thermal spraying. This structure is clearly different from the more homogeneous microstructure obtained by e.g. sintering.

Where in embodiments of the present invention reference is made to "ceramic target" or "ceramic character" of a composition, reference is made to a target or a composition including a metal and a further non-metallic element or elements. In embodiments of the present invention, it includes a metal (in particular but not exclusive tungsten) and oxygen, forming a metal oxide where the amount of oxygen is substantial, not zero, and the amount of oxygen atoms frequently surpasses the number of atoms of metal in the compound.

Where in embodiments of the present invention reference is made to "carrier", reference is made to the piece on which sputtering material can be provided. Carriers include a surface on which the target material is provided, and it may include other elements such as cooling circuits or the like.

The target may be, for example, a planar or tubular target.

Cylindrical targets typically comprise one carrier, being a backing tube. Production of these cylindrical targets by spraying typically comprises providing a single piece of target material on the backing tube, the tube possibly containing a bonding layer. Other cylindrical target material production technologies may provide target material in the shape of cylindrical sleeves that are slid over the single backing tube and consequently bonded on it, e.g. by providing a material between the sleeve and the backing tube.

On the other hand, large planar rectangular magnetrons may require a target assembly consisting of several pieces; often referred to as tiles. Each tile may contain a substantially rectangular block of target material, which can be possibly bonded as individual small rectangular tiles on one backing plate. It is also possible to produce these planar targets by spraying, typically providing a single piece of target material on the backing plate thereby obtaining a planar target.

In the frame of the present invention, target material is provided on the carrier by spraying material on a surface of the carrier, optionally on a binding layer provided on the surface of the carrier, thereby binding the sprayed material to the carrier. Hence, a carrier and a single piece of sprayed target material may form a target.

The target may be configured for sputter deposition, for example it may be mounted onto a magnetron for energizing, cooling, supporting the target and the like; for example it may be configured to provide rotation, in case of a cylindrical target.

In a first aspect, the present invention relates to a ceramic target for sputtering, for deposition of layers containing tungsten oxide. The ceramic target may have a single piece of material for sputtering, with no grooves. The material for sputtering is conductive, allowing sputtering at sub-RF frequencies, and it contains a substantial amount of oxygen-deficient tungsten oxide or compounds thereof.

The target comprises a single piece of target material, for example only one single piece, which may be provided on a carrier, e.g. a planar carrier or a tubular carrier. A planar target can include one planar carrier and a single piece target material. Several targets including for example (but not limited to) one piece only per carrier can be used as a target assembly, e.g. for forming a plasma racetrack.

The single piece of target material can be formed by spraying material onto a carrier, as it will be explained below. The sprayed material forms splats upon impact with the underlaying surface. Accumulation of these splats forms a lamellar structure of overlapping splats that result in the build of a coating. A cross section of a sprayed ceramic tungsten oxide target in shown in FIG. 1. The micrograph is amplified 500 times; the scale bar is at 50 microns. Some porosities are shown as black areas, and extended dark lines between clear zones represent borders between individual splats.

The overlapping splats have usually a large area but comparatively small thickness, and accumulation of these forms the lamellar structure. The interlocked lamellar structure and porosities may provide stress relief during manufacturing and handling the target.

Despite the ceramic character of the composition, the method of manufacturing the target by spraying can provide enough thickness of material for allowing commercial sputtering. The manufacturing process, by spraying material on a carrier, also allows the provision of material for sputtering as a single piece on the carrier, for example one single piece, with a continuous surface, e.g. without grooves or discontinuities separating many tiles or sleeves on a carrier. Problems such as arcing or erosion associated to the presence of these grooves are therefore not present in embodiments of the present invention. The thickness of the piece of material for sputtering may be 1 mm or more, for example at least 2 mm, for example 4 mm of target material or even thicker, e.g. 6 mm or more while the mechanical properties still allow reliability (e.g. without making the target too brittle to be handled safely).

The target material for sputtering comprises metal oxide, in particular at least a tungsten oxide, for example:
a metal oxide and a metal or mixture of several metal oxides and one or more metals, a metal oxide being a tungsten oxide, or
a tungsten oxide, or mixture of one or more metal oxides and tungsten oxide.

The target material comprises in particular at least 40 wt. %, for example at least 50 wt. %, such as 60 wt. % or 80 wt. % or at least 90 wt. % or even 95 wt. % or more of tungsten oxide. It is noted that impurities may also be present.

The atomic ratio of oxygen over metal in the target material is oxygen-deficient with respect to the stoichiometric composition of the metal oxide. Thus, the target material is a suboxidic composition of the metal oxide. The atomic ratio of oxygen over metal is at least 0.05 lower than its stoichiometric composition. In some embodiments of the present invention, the metal oxide is a suboxidic composition, which may be mixed with other metal oxides or metals.

The measurement of the amount of non-metallic elements in a ceramic is done using a standard method. Standard methods include, for example, gravimetric-based techniques for analysis of oxygen, or combustion analysis.

For example, in thermogravimetric-based techniques, the material is fully oxidized by heating it. The difference in weight before and after full oxidation is measured, which allows to calculate the amount of oxygen interchanged during the heating. An example is given for titanium oxide material, TiOx, being a suboxidic composition. The material is weighted, obtaining m(TiOx). The material is heated up at 1000° C. for one hour, so the material becomes fully oxidized, TiO2. The material is weighted again, obtaining m(TiO2). Then, the amount of substoichiometric oxygen x before the oxidation can be obtained:

$$x = MM(\text{TiO2}) \frac{(m(\text{TiOx}/m(\text{TiO2}))}{AM(O)} - \frac{AM(\text{Ti})}{AM(O)}$$

where MM is the molecular mass of the corresponding composition, and AM is the atomic mass of the corresponding element.

This measurement method can be readily applied to any other metal oxide by suitably adapting the cycle and/or oxidating temperatures.

For example, combustion analysis can provide oxygen analysis, and may measure other elements such as nitrogen. A commercial oxygen/nitrogen analyser, such as EMGA-620W, can be used. For example, a graphite crucible may be placed between an upper and lower electrodes in an extraction furnace. When a high current is passed through the graphite crucible between the electrodes, the temperature of the crucible is increased rapidly by Joule heating. Raising the temperature outgasses the crucible. The sample of the material is then introduced and the temperature increased again for thermal decomposition. The O, N and H in the sample are carried to the detectors by a carrier gas (such as helium introduced into the furnace) in the forms of CO, N2 and H2 respectively. A nondispersive infrared detector and a thermal conductivity detector (TCD) detect the CO and the N2, respectively. A decarburizer and dehydrator can be used to isolate the nitrogen gas before the TCD. Additional devices, such as flow meters, flow controllers and gas lines can be used.

The detectors output a signal corresponding to the concentration of the gas detected. This signal is linearised and integrated by a microprocessor, then blank corrected in accordance with a calibration curve and corrected for sample weight. The resulting data is displayed as the measurement results.

In particular, the target material comprises tungsten oxide as mentioned earlier, and the tungsten oxide is a suboxidic tungsten oxide $WO_x$ where x is lower than 3, which may be mixed with metals (such as metallic tungsten) and/or other oxides (such as nickel oxide or suboxidic variants thereof, $NiO_y$, where y<1).

In particular embodiments, the atomic ratio of oxygen and tungsten in the material for sputtering is lower than 3 and higher than 2. For example it may be 2.95 or lower, for example 2.9 or lower. It may be 2.5 or higher, for example 2.7 or higher. Thus, this ratio is oxygen-deficient with respect to $WO_3$.

Then, the oxygen deficiency of the material for sputtering may stem from
- non-stoichiometric, suboxidic $WO_x$ compositions of tungsten oxide $WO_3$ raw material, e.g. powder or
- a mixture of tungsten oxide $WO_3$ and metallic tungsten, or
- a mixture of tungsten oxide, metallic tungsten and suboxidic compositions $WO_x$ relative to the tungsten oxide $WO_3$, or
- spraying tungsten oxide $WO_3$ in a reducing atmosphere (e.g. by adding hydrogen to the spraying ambient or by any other suitable reducing means) thus providing splats with suboxidic composition.

These materials may be provided in sprayable form, for example in the form of powder, and sprayed to form the material for sputtering of the target thereby providing the lamellar structure. In some embodiments, the material is provided in different forms. For example, wires or tubes may be provided. For example, spraying can be performed by feeding metal tungsten wire and $WO_3$ powder, or a hollow W wire or tube filled with $WO_3$ powder may be used. The spraying process may be provided by an arc discharge between a wire and an electrode, e.g. a W electrode or another hollow W wire filled with $WO_3$ powder.

Existing non-conductive ceramic targets can be sputtered, but they usually require radiofrequency (RF) sputtering (in the order of MHz, for example between 0.3 MHz or 0.5 MHz and 100 MHz), which presents many technical drawbacks. These include a high cost of power electronics per provided unit of power, complexity of matching the radio frequency signal with the magnetron configuration while keeping the power losses and reflected power to a minimum, lower sputtering efficiency for a given power level, hard to distribute RF power density uniformly over larger target sizes (e.g. exceeding 0.5 m). In embodiments of the present invention, the target can sputter at frequencies under RF frequencies, e.g. under 0.5 MHz, for example under 0.3 MHz, allowing sputtering in large areas of substrate, at pulsed DC or MF AC conditions, even using large targets (e.g. of 0.5 m or more). The oxygen-deficient composition of the target material in the target of the present invention confers conductivity to the material for sputtering, making the target suitable for middle-frequency AC sputtering or even DC sputtering. In other words, the material for sputtering is conductive while at the same time providing sputtering of tungsten oxide, allowing more flexibility in power usage and better arc management settings, even improving stability in large area sputtering. The conductivity may be 1000 ohm·cm or lower, e.g. 100 ohm·cm or lower, preferably under 0.01 ohm·cm, so sputter deposition is possible at DC up to middle frequencies of AC, for example frequencies up to 250 kHz or less.

In some embodiments, the target includes mainly or essentially oxygen-deficient tungsten oxide, with oxygen/tungsten ratios discussed above (over 2 and under 3), where oxygen deficiency may stem from a mixture of particles (e.g. sprayed particles) of metallic tungsten and tungsten oxide, e.g. tungsten trioxide (stoichiometric) and/or tungsten suboxidic particles.

In some embodiments, the target includes a non-stoichiometric, suboxide composition of tungsten oxide $WO_3$. In this particular embodiment, the target material comprises a tungsten oxide where the oxygen content in the tungsten oxide is non-stoichiometric. In other words, the material for sputtering comprises $WO_x$, the value x being strictly lower than 3 and different from 2. In some embodiments of the present invention, the suboxidic composition $WO_x$ has an x with a value strictly higher than 2 and strictly lower than 3, so the oxygen content falls between the oxygen content found in stoichiometric tungsten dioxide ($WO_2$) and stoichiometric tungsten trioxide ($WO_3$), for example 2.95 or lower, for example 2.9 or lower. The O/W ratio may also be higher than 2, for example 2.5 or higher, for example 2.7 or higher. Optionally, metallic tungsten and/or $WO_3$ may also be present.

Figure 2:
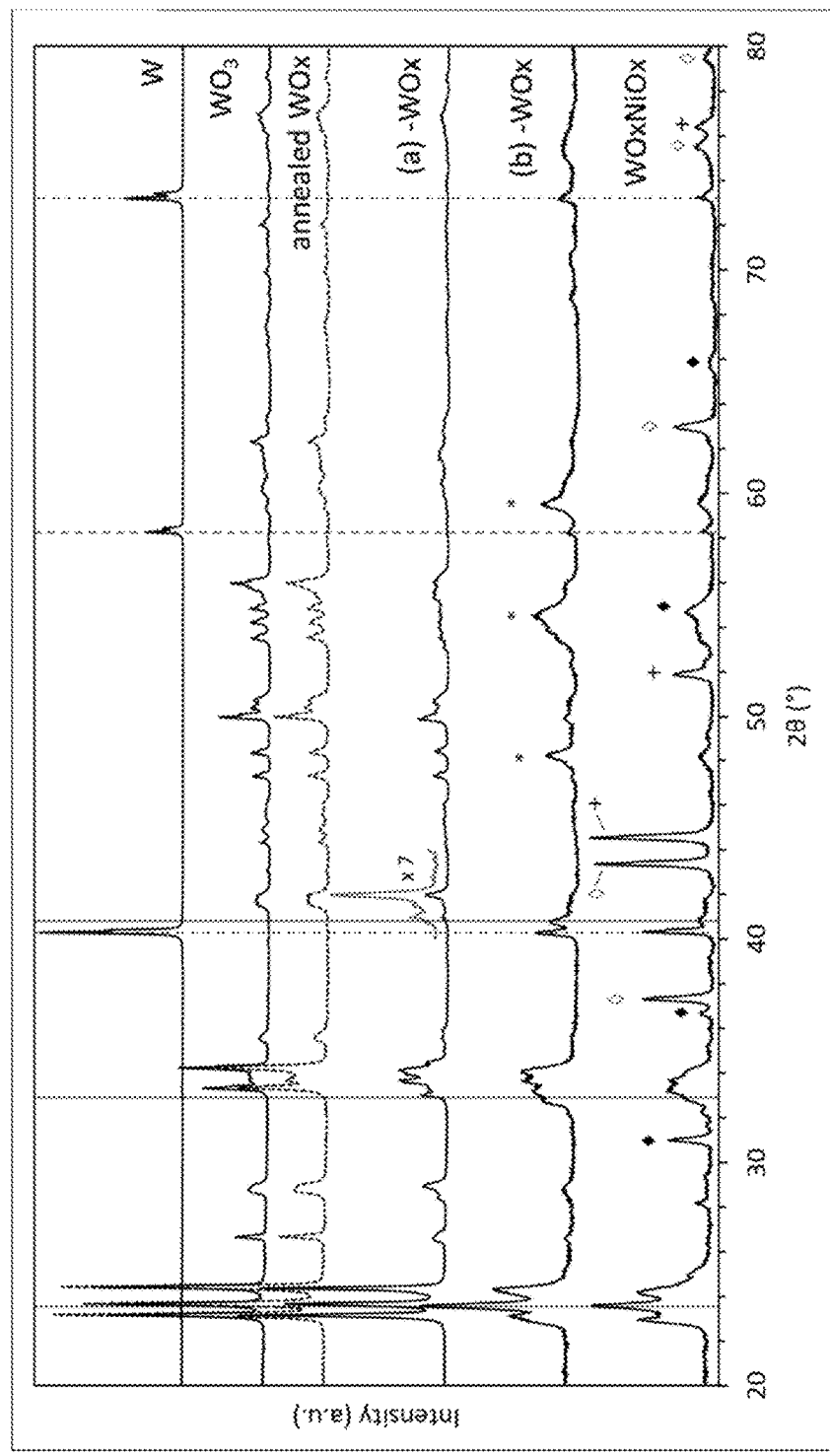
FIG. 2 illustrates XRD graphs of metallic tungsten, as-sprayed and annealed suboxidic tungsten oxides, tungsten oxide $WO_3$ and a metallic oxide including tungsten and nickel.

Other metals and metal oxides may be present, together with tungsten oxide(s). FIG. 2 shows the powder X-ray diffraction (XRD) patterns of samples of pure cubic metallic tungsten (W), pure monoclinic tungsten oxide ($WO_3$), two tungsten suboxides (a-$WO_x$ and b-$WO_x$), and a mixed-phase tungsten-nickel suboxide ($WO_xNiOy$). Samples 'a' and 'b' of $WO_x$ correspond to as-deposited sprayed coatings with lower and higher oxygen deficiency, respectively. The XRD pattern of the annealed, fully oxidized b-$WO_x$ coating is also shown (dotted XRD pattern) and it is the same for a-$WO_x$ (not shown). All samples belong to sprayed rotatable sputter targets except for $WO_3$, which is a stoichiometric powder used for reference purposes.

Typically, XRD patterns of tungsten suboxides include several overlapping XRD reflections from different stable tungsten suboxide $WO_x$ phases with different x-values depending on the degree of oxygen deficiency in the material. These reflection peaks are often broader than for stoichiometric $WO_3$ due to the increased structural disorder, and many coincide in position with characteristic peaks from different $WO_3$ polymorphs. Moreover, reflections at angles matching metal tungsten are sometimes detected for highly reduced $WO_x$ phases. Although all these features result in complex diffractograms, target materials including non-stoichiometric tungsten oxide—$WO_x$ with x between 2 and 3—show specific Bragg peaks in powder XRD patterns that can be used as fingerprints of their presence. Such is the case of the Bragg peaks for $WO_x$ and $WO_xNiOy$ targets indicated as solid lines in FIG. 2 at 25°±0.3°, 32.7°±0.3°, and 40.7°35 0.3° (Cu-K alpharadiation). Only the two latter peaks are also present in a-$WO_x$ with a lower oxygen deficiency, where the latter has been enlarged 7 times for clarity. Additionally, even though only tungsten oxide was used as feedstock material for production of these targets, the position and intensity of the peaks indicated with dashed lines match reflections from pure W in b-$WO_x$. This seems to indicate the presence of domains of pure metal due to further reduction of tungsten oxide during the spraying process for b-$WO_x$. These W peaks are not observed in a-$WO_x$ with lower oxygen deficiency, and its overall XRD pattern resembles more the one of stoichiometric $WO_3$. The above described XRD peaks, assigned to the presence of $WO_x$ and W, disappear upon annealing at 750° C. of samples 'a' and 'b' of $WO_x$, confirming their identification as oxygen-deficient phases. Both peaks at 32.7°±0.3°, and 40.7°±0.3° are always common to $WO_x$-based non-stoichiometric target materials with different x-values, but the first peak is sometimes more poorly resolved than the second. Thus, it can be concluded from the above that at least the peak at 40.7°±0.3° is always unequivocally exclusive of $WO_x$ phases. Without being bound to theory, it is believed the peak stems from the presence of orthorhombic tungsten suboxides. Other Bragg peaks (indicated with asterisks), and their different intensities as compared to $WO_3$ reference, are also suggestive of the presence of $WO_x$ suboxides in b-$WO_x$ and $WO_xNiOy$, but they cannot be unmistakably distinguished from other $WO_3$ phases. It is also worth noticing that b-$WO_x$ and $WO_xNiOy$ targets show a distinctive triplet close to 23.1°±0.3°, 23.5°±0.3° and 24.3°±0.3° positions, with the middle peak being higher in intensity than the others. This intensity ratio is often observed in suboxide forms of tungsten. For W, these triple peaks are absent and for a-$WO_x$ and $WO_3$, the middle of the triple peaks is clearly not the most intense. So, in general it can be concluded that the XRD pattern of a sprayed tungsten oxide target in accordance with the present invention will include at least a peak specific for tungsten oxide, positioned at 23.5° and a peak originating from W or $WO_x$ or both, being positioned at 40.2° and/or 40.7°, depending on the stoichiometry.

For $WO_xNiOy$, XRD peaks assigned to Ni (indicated with a cross), NiO (indicated with a blank diamond) and $NiWO_4$ (indicated with a full diamond) are also shown. In this case, the XRD of a sprayed $WO_xNiOy$ target will contain the above mentioned peaks corresponding to tungsten oxides and at least one of the following peaks at 44.5°±0.3° (Ni metal) and/or 43.3°±0.3° (NiO) and/or 31.0°±0.3° (NiWO4) depending on the feedstock material of choice.

In some embodiments, the material for sputtering of the target may be essentially oxygen-deficient tungsten oxide. In some embodiments the target may comprise essentially any mixture of metallic tungsten, tungsten oxide and suboxidic tungsten oxide. With 'essentially' it is meant that impurities, usually unavoidable impurities may be typically present in manufacture of commercial targets.

In some embodiments, the material for sputtering may comprise 95 wt. % or more of oxygen-deficient tungsten oxide as defined above. In some embodiments, the material for sputtering may include at least 40 wt. %, such as 50 wt. % or 60 wt. % or 70 wt. % or 80 wt % or 90 wt % or even 95% wt. % of oxygen-deficient tungsten oxide.

In some embodiments, the material for sputtering includes a fraction of metallic tungsten, for example a mass fraction lower than 28 wt. % of metallic tungsten W, for example in a mixture of W and WO3, such that x in $WO_x$ is higher than 2. In some embodiments, the balance material comprises $WO_3$ and/or suboxidic compositions as explained earlier.

The material for sputtering may comprise a further material as material balance, e.g. another metal or metal oxide, different from tungsten, e.g. metallic nickel or metallic lithium. For example, an alkali oxide and/or transition metal oxide can be included. For example, one or more oxides of alkali metal can be provided as target material or part thereof, which may include LiOx, NaOx, KOx. For example, one or more oxides of a transition metal can be provided as at least part of the target material, which may include e.g. TiOx, CrOx, NiOx, MoOx, ZrOx, NbOx, AgOx, TaOx, . . . . In particular, nickel oxide, chromium oxide, and/or molybdenum oxide may be included as material balance.

Alkali oxide may provide positive ions so these compositions can be used as electrochromic materials. Transition oxides can be used to tailor optical as well as mechanical properties of the oxide layer. Some combinations of oxides can be used in sensor applications. However, the present invention is not limited to these materials for sputtering.

In some embodiments, as explained earlier, a target may include tungsten oxide, in particular of suboxidic $WO_x$ as defined before, e.g. between 40 wt. % and 60 wt. %, and as a balance nickel oxide. For example, the weight ratio of metallic W:Ni may be in the range 30:70 to 70:30, more specifically in the range 40:60 to 60:40. Typically the weight ratio of tungsten and nickel can be close to 50:50. FIG. 2 shows the XRD pattern of $WO_xNiOy$, for example, including substoichiometric oxides $WO_x$ and/or NiOy, for example as splats of substoichiometric oxide.

Figure 4:
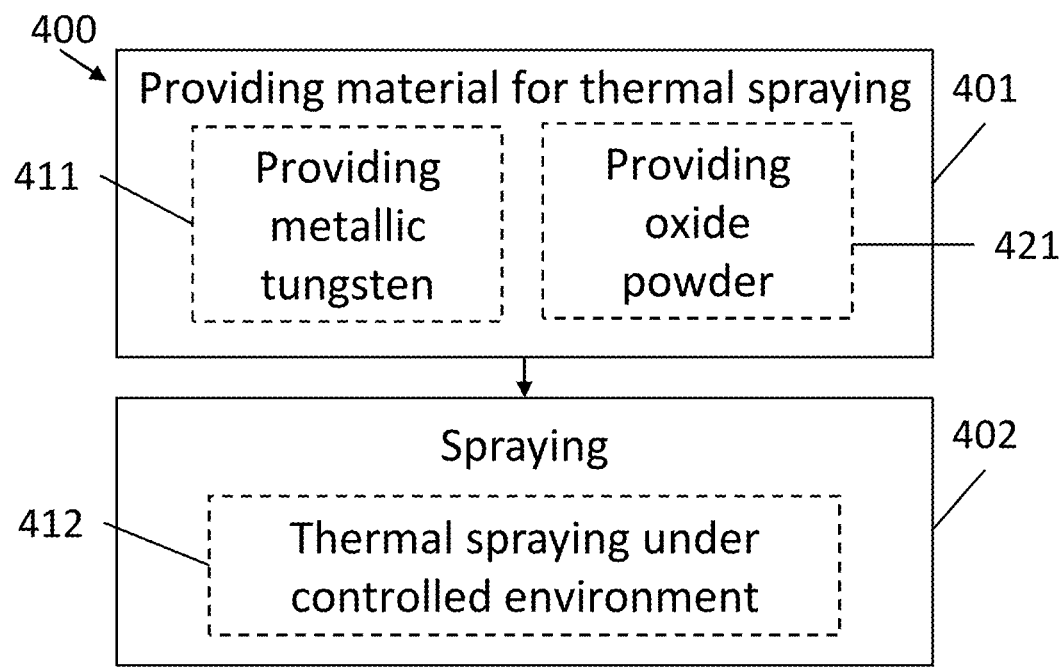
FIG. 4 is a flowchart for manufacturing a sputtering target in accordance with embodiments of the present invention.

In another aspect of the present invention, a method of manufacturing a target is provided. FIG. 4 shows a flowchart with steps of the method. The method of manufacturing 400 includes providing 401 material containing tungsten and spraying 402 it in order to form a piece for sputtering including at least tungsten oxide. Providing the material for spraying may comprise providing 411 metallic tungsten, providing 421 tungsten oxide powder, or a mixture of both.

The material may be sprayed under controlled gas atmosphere and may be chosen appropriately for favoring oxidation or reduction of the sprayed material. In some embodiments, however, the material can be sprayed in air, thus advantageosuly simplifying the process. The material is sprayed, for example over the surface of a carrier, optionally over a binding layer provided on the surface of the carrier, until at least 1 mm of material for sputtering is provided, or 2 mm, or 4 mm or even 6 mm or more, as material for sputtering. The material for sputtering may be a single-piece target material for sputtering, for example only one single piece of material for sputtering provided on one carrier (e.g. one carrier including a binding layer). Embodiments of the present method provide a target in accordance with embodiments of the first aspect of the present invention.

The method may comprise providing a carrier, for example a planar carrier, or a tubular carrier, and spraying the material over the carrier.

In embodiments of the present invention, the method may comprise spraying the material in presence of oxygen at concentrations such that the desired amount of oxygen is included as part of the target material. The amount of oxygen is chosen in accordance with the desired oxygen-tungsten ratio desired in the oxygen-deficient tungsten trioxide material.

In some embodiments, metallic tungsten can be added to a metal oxide for the spraying process in presence of oxygen. Preferably, tungsten oxide is provided (optionally including metallic tungsten and/or an oxide of a different metal), prepared for spraying, and sprayed, e.g. on a target carrier. In some embodiments this is done in presence of a controlled amount of oxygen, for example in a controlled atmosphere comprising a predetermined amount of oxygen. In some embodiments, tungsten oxide and metallic tungsten can both be prepared for spraying and mixed, in order to reduce the oxygen-tungsten ratio if required.

In particular embodiments, spraying comprises thermal spraying 412. In such cases, preparing the material for spraying may comprise providing powdered material and increasing the temperature thereof as known in the prior art, for example reaching the temperature of the melting point of the material. Thermal spraying may comprise for example plasma spraying, atmospheric plasma spraying (APS), plasma spraying in oxidizing environment, or in reducing environment, or even in protective environment (e.g. vacuum plasma spraying). This allows controlling, e.g. reducing the amount of oxygen in the target material. In some embodiments of the method, the spraying environment may comprise inert gases such as argon, optionally mixed with controlled amounts of oxygen. The amount depends on the desired amount of oxygen present in the oxygen-deficient piece of material for sputtering. However, the present invention is not limited to plasma spraying, and other types of thermal spraying may be used, such as for example HVOF or flame spraying.

In a further aspect of the present invention, a target in accordance with embodiments of the first aspect is provided in accordance with embodiments of the method of the present invention. In particular, a target including metal oxide comprising 40 wt. % $WO_x$ can be provided, where the metal-oxygen ratio is sub-stoichiometric. For example, for a tungsten oxide target, where the majority of the target is a tungsten oxide and impurities, the value of x may be lower than 3. It could even be lower than 2, for example by adding sufficient metallic W. However it is preferred a value strictly higher than 2 and strictly lower than 3, so the hysteresis behavior typical of metallic targets is minimal or is completely avoided, further allowing easy process stability and higher DDR. This is further explained below.

In a further aspect of the present invention, use of a target of embodiments of the first aspect of the present invention is provided, in order to provide a sputtered layer of material containing stoichiometric $WO_3$ or non-stoichiometric tungsten oxide. On purpose, oxygen-deficient tungsten trioxide $WO_x$, where x is lower than 3 and higher than 2, for example 2.3 or higher, for example 2.5 or higher, for example 2.7 or higher, and lower than 3, for example 2.95 or lower, for example 2.9 or lower, may be produced during the sputtering process. Sputtering in a pure Ar gas ambient may have the tendency to further reduce (lowering the x-value of) the layer composition relative to the target composition. Adding oxygen during the sputtering process may increase the oxygen content of the layer relative to the process in pure Ar and more provide a layer being similar to the target composition or being closer to stoichiometric or even be over stoichiometric (x higher than 3) if excess oxygen can be incorporated during the layer formation.

The use of such targets in accordance with embodiments of the present invention allows using sub-RF, in particular mid-frequency AC and DC sputtering, unlike stoichiometric tungsten oxide targets. Additionally, the targets in accordance with embodiments of the present invention provide advantageous sputtering process over metal tungsten targets.

Figure 3:
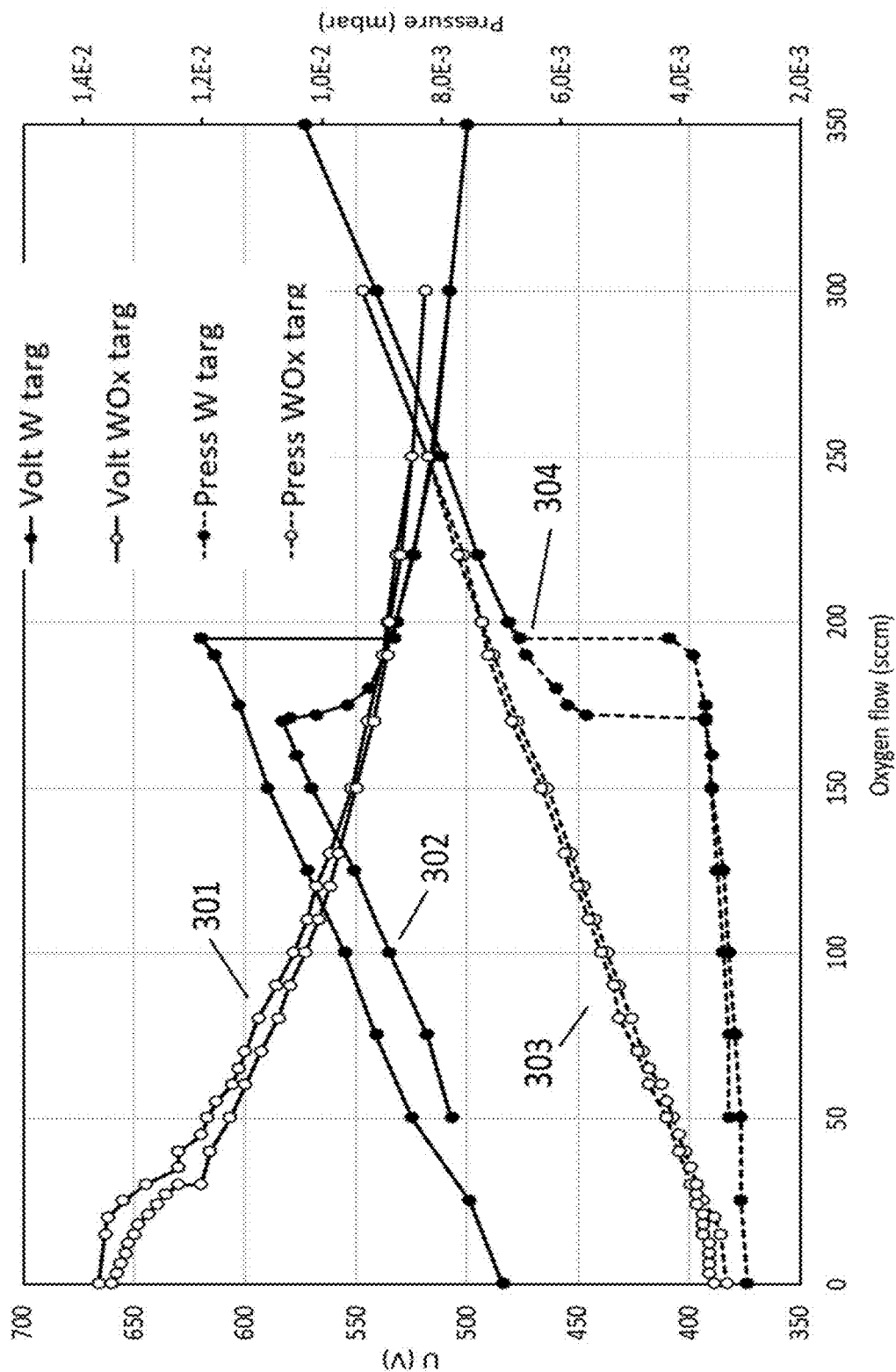
FIG. 3 is a graph showing the sputtering voltage and pressure as a function of oxygen flow for sputter deposition using a target in accordance with embodiments of the present invention, compared to metallic targets.

FIG. 3 shows the working curve of sputtering, i.e. the sputtering voltage and pressure as a function of oxygen flow, of a metal tungsten target compared to a target in accordance with the present invention. Curves 301, 302 show the sputtering voltage of the present target and of a metal tungsten target respectively, as a function of the oxygen flow (in standard cubic centimeter per minute (sccm)). Curves 303, 304 show the pressure change in mbars of the sputtering chamber when using the present target and a metal tungsten target respectively, as a function of oxygen flow. In case of metal targets, a hysteresis cycle appears which indicates a cycle of target poisoning and target cleaning, depending on whether the amount of oxygen increases or decreases.

Figure 5:
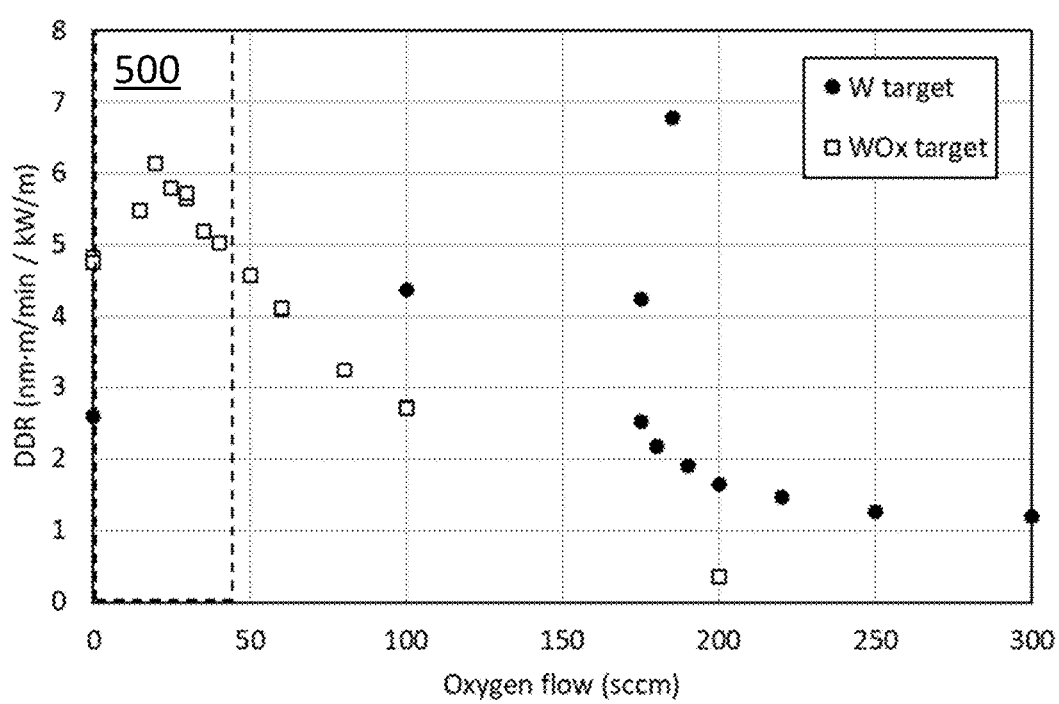
FIG. 5 is a graph showing the dynamic deposition rate as a function of the oxygen flow, for deposition using a target in accordance with embodiments of the present invention, compared to metallic targets.

FIG. 5 shows the dynamic deposition rate (DDR) as a function of the oxygen flow for metal tungsten targets as compared to suboxidic tungsten oxide ceramic targets in accordance of embodiments of the present invention. The filled circles show the DDR for metal tungsten targets. The empty squares show the result for a tungsten oxide target. It can be seen that metal targets may provide a high deposition rate, however corresponding with a metallic mode in the transition zone and resulting in a metallic and absorbing layer. Only for oxygen flows of 170 sccm and larger while reaching these values from the poisoned mode (by reducing the oxygen flow) a consistent deposition rate of 2.6 nm·m/min/(kW/m) or lower may be obtained, while the deposited layer is transparent. However, for ceramic targets, the DDR presents a maximum at a low flow rate of oxygen (at around 25 sccm) and then steadily decreases. The DDR using ceramic targets for depositing a WOy layer with y>2 is larger than from metals targets. In addition, much lower oxygen flows are needed from the ceramic target while the target itself is a substantial source of oxygen. The DDR for forming WO3 layers from metallic targets at 170 sccm (while reducing the oxygen flow) is close to half of the DDR with a ceramic target at 50 sccm. It is noted that, for values of oxygen flow under 50 sccm (the zone within the rectangle 500) with ceramic sputtering, the layer deposited by sputtering is not fully transparent, indicating a tungsten suboxide. Outside that area, the layer is transparent, indicating deposition of a stoichiometric metal oxide $WO_3$. While using excess oxygen with respect to the transition point to poisoned mode (dashed line) for the ceramic target (above ~45 sccm), the DDR remains significantly higher than using similar excess oxygen for the metallic target (above 170 sccm). Therefore, the deposition process is not only easier to control for the ceramic target because of absence of the hysteresis behavior (FIG. 3), it also enables sputtering faster for the same power level. The latter advantage is dual. Faster sputtering allows depositing the desired layer thickness in a shorter time frame and may allow more throughput for the same coater configuration. If throughput is not an issue, a similar thickness may be provided at about half the power level, giving important energy saving and reducing the ecological footprint for realizing the same coating layer.

Using such targets may increase dramatically the deposition rate over metal targets, up to twice the deposition rate as with metal targets, while allowing deposition of suboxidic (oxygen-deficient) $WO_x$ layers on a substrate, for deposition of a sputtered film with similar optical properties (and hence, similar tungsten to oxygen ratio).

The table below shows further characteristics of targets in accordance with the present invention, as compared to metal targets provided by thermal spraying.

The resistivity is low enough to provide DC sputtering for an oxygen content below 2.95, or middle frequency sputtering, e.g. hundreds of kHz, e.g. 250 kHz. The resistivity of the target material may be lower than 1000 Ohm·cm, e.g. being lower than 10 Ohm·cm, even being lower than 1 Ohm·cm, such as being lower than 0.1 Ohm·cm, for example 0.01 Ohm·cm or lower. For example, in some embodiments of the present invention comprising WOxNiOx the resistivity may be under 0.01 Ohm cm.

TABLE 1

Metallic W target (W) and target (WOx) of the present invention.

| | W | WOx |
|---|---|---|
| Technology | Thermal Spray | Thermal Spray |
| Density | >15 g/cm3 | >5.2 g/cm3 |
| Porosity | <15% | <15% |
| Oxygen | <5000 ppm | x~2.3-2.95 |
| Resistivity | <0.0001 Ω · cm | <0.01 Ω · cm |
| Max DC power | 30 kW/m | 15 kW/m |
| Max AC power | 60 kW/m | 30 kW/m |

The invention claimed is:

1. A target having a single piece target material for sputter deposition,
    wherein the target comprises at least 1 mm or more of thickness of material for sputtering having a lamellar structure, the material for sputtering further comprising a metal oxide with at least 50 wt. %, of tungsten oxide where the atomic ratio of oxygen over tungsten results in a compound with oxygen deficiency with respect to the stoichiometric tungsten oxide,
    wherein the tungsten oxide comprises non-stoichiometric tungsten oxide wherein the ratio of oxygen over tungsten is higher than 2 and lower than 3.

2. The target of claim 1, wherein the single piece target material has a length of at least 0.5 m long or larger.

3. The target of claim 1, wherein the target material has a resistivity lower than 1000 Ohm·cm.

4. The target of claim 1, wherein the ratio of oxygen over tungsten is 2.5 or higher.

5. The target of claim 1, wherein the material for sputtering has a diffraction peak at a Bragg angle (2θ) of 23.5°±0.3° and additionally at least one of the following diffraction peaks at a Bragg angle of 40.7°±0.3°, and/or 40.2°±0.3°, and/or 32.7°±0.3° in a powder X-Ray diffraction spectrum measured with Cu-K alpha radiation.

6. The target of claim 1, wherein the material for sputtering has diffraction peaks at Bragg angles (2θ) of 23.1°±0.3°, 23.5°±0.3° and 24.3°±0.3° where the peak at 23.5°±0.3° is the highest in relative intensity of these three peaks in a powder X-Ray diffraction spectrum measured with Cu-K alpha radiation.

7. The target of claim 1, wherein the material for sputtering includes at least a fraction of metallic tungsten.

8. The target of claim 1, wherein the material for sputtering includes at least a further metal oxide as material balance.

9. The target of claim 8, wherein the metal oxide comprises one or more of an alkali metal oxide.

10. The target of claim 8, wherein the material for sputtering comprises nickel oxide and has additional diffraction peaks at Bragg angles of 44.5°±0.3° from Ni metal and/or 43.3°±0.3° from NiO and/or 31.0°±0.3° from NiWO4 in a powder X-Ray diffraction spectrum measured with Cu-K alpha radiation.

11. A method of providing the target of claim 1 comprising providing material for sputtering by providing material comprising tungsten oxide powder and spraying the material, where spraying is done in amounts to provide a layer of material for sputtering being at least 1 mm and comprising non-stoichiometric tungsten oxide.

12. The method of claim 11 further comprising spraying the material on a carrier surface, thereby forming a target with one single piece of target material uniformly provided over a substantial part of the surface of the carrier, optionally being at least 0.5 m long or at least 1 m long on its longest side, forming a target with only one single piece of target material uniformly provided over the surface of the carrier.

13. The method of claim 11, wherein spraying comprises thermal spraying, controlling the spraying parameters and/or the atmospheric environment during the process as a means to tune the metal to oxide ratio of the tungsten oxide target material.

14. Use of a ceramic target in accordance with claim 1 for providing a layer comprising or consisting of tungsten oxide on a substrate by sputter deposition, optionally for providing a layer comprising or consisting of non-stoichiometric oxygen-deficient tungsten oxide on a substrate by appropriate control of oxygen gas during the deposition process.

\* \* \* \* \*